(12) United States Patent
Yoshihara (10) Patent No.: US 6,512,254 B2
(45) Date of Patent: Jan. 28, 2003

(54) SOLID-STATE IMAGE PICKUP DEVICE (75) Inventor: Satoshi Yoshihara, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/931,464

(22) Filed: Aug. 17, 2001

(65) Prior Publication Data

US 2002/0060329 A1 May 23, 2002

(30) Foreign Application Priority Data

Aug. 28, 2000 (JP) ......................................... 2000-257463

(51) Int. Cl.[7] ........................ H01L 27/10; H01L 27/148; H01L 29/768
(52) U.S. Cl. ........................ 257/223; 257/236; 257/239; 257/240; 257/250
(58) Field of Search ................................. 257/236, 239, 257/240, 250, 223

(56) References Cited

U.S. PATENT DOCUMENTS

| 4,984,045 | A | * | 1/1991 | Matsunaga | |
| 4,993,053 | A | * | 2/1991 | Itoh et al. | 377/60 |
| 5,539,226 | A | * | 7/1996 | Kawamoto et al. | 257/239 |
| 6,310,369 | B1 | * | 10/2001 | Narabu et al. | 257/239 |

* cited by examiner

*Primary Examiner*—Ngân V. Ngo
(74) *Attorney, Agent, or Firm*—Rader, Fishman & Grauer PLLC; Ronald P. Kananen, Esq.

(57) ABSTRACT

In a solid-state image pickup device, a transfer register 10 is provided with an overflow control gate OFCG and an overflow drain OFD, and the gate electrode 12A of the overflow control gate OFCG is formed so as to be superposed on the lower-layer electrodes St1, 13 of the transfer register 10 side and the overflow drain OFD side.

7 Claims, 6 Drawing Sheets

SOLID-STATE IMAGE PICKUP DEVICE

BACKGROUND OF THE INVENTION

1. Field of the Invention

The present invention relates to a solid-state image pickup device having a transfer register with an overflow drain.

2. Description of the Related Art

According to a conventional technique, when overflow control is carried out in a transfer register of a CCD solid-state image pickup device, an overflow barrier is formed at the side of a polycrystal silicon layer serving as a lower layer constituting a storage electrode of the transfer register by a polycrystal silicon layer serving as an upper layer and an implant for a barrier.

Figure 5:
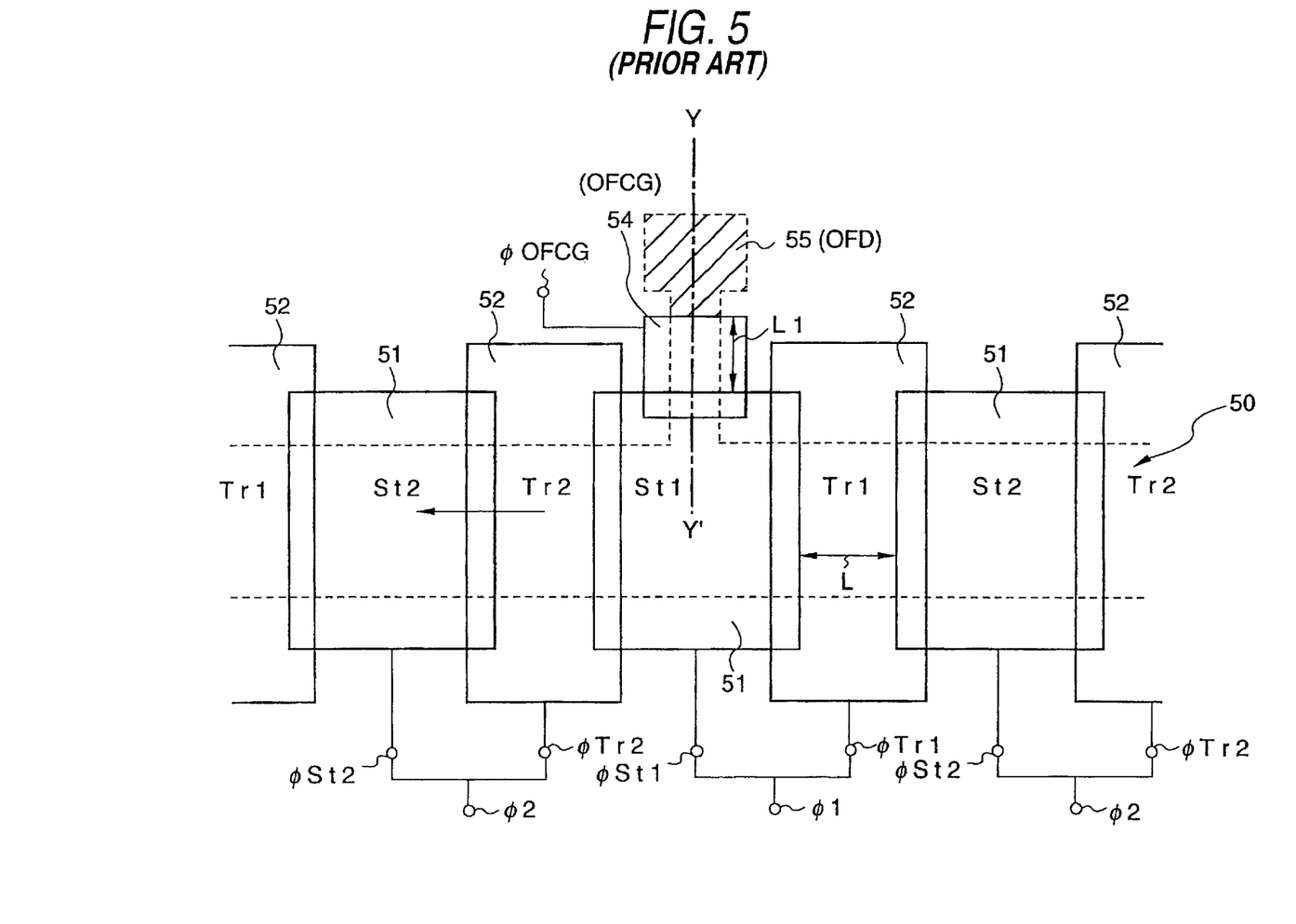
FIG. 5 is an enlarged plan view showing the main part of a transfer register of a conventional CCD solid-state image pickup device.

FIG. 5 is a schematic diagram (plan view) showing a conventional overflow controlling structure.

As shown in FIG. 5, first-layer transfer electrodes 51 and second-layer transfer electrodes 52 are alternately arranged on a transfer register 50. The first-layer transfer electrodes 51 serve as storage electrodes St1, St2, and the second-layer transfer electrodes 52 serve as transfer electrodes Tr1, Tr2.

A first-phase driving pulse φ1 is applied as driving pulses φSt1, φTr1 to the storage electrode St1 and the transfer electrode Tr1 respectively, and a second-phase driving pulse φ2 is applied as driving pulses φSt2, φTr2 to the storage electrode St2 and the transfer electrode Tr2, respectively. Further, an overflow control gate OFCG and an overflow drain OFD are provided at the side of the first-phase storage electrode St1 disposed substantially at the center of FIG. 5.

Figure 6:
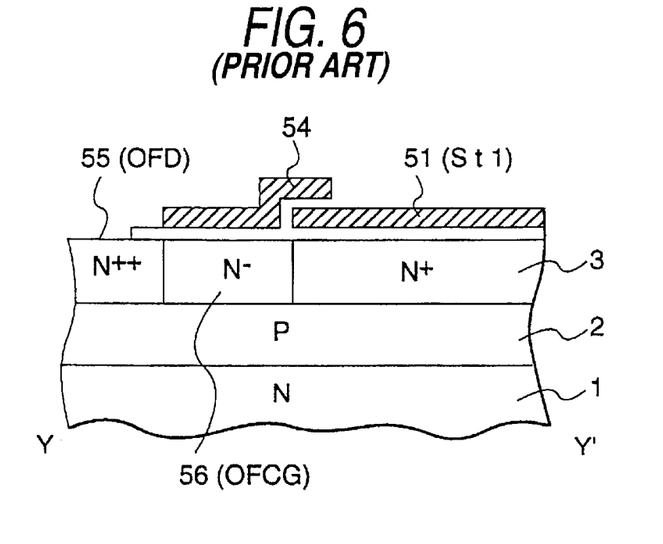
FIG. 6 is a cross-sectional view taken along Y–Y' of FIG. 5.

FIG. 6 is a cross-sectional view taken along Y–Y' of FIG. 5.

As shown in FIGS. 5 and 6, the overflow control gate OFCG comprises a gate electrode 54 and an N⁻ area 56. The gate electrode 54 is formed of the same second-layer polycrystal silicon layer as the second-layer transfer electrodes 52 constructing the transfer electrodes Tr1, Tr2. A driving pulse φOFCG is applied to the gate electrode 54.

In the N⁻ area 56, N-type impurities are ion-implanted into a P-type well region 2 of a semiconductor substrate 1.

The overflow drain OFD is constructed by an N⁺⁺ area 55 which is formed by ion-implanting high-concentration N-type impurities into the P-type well region 2 of the semiconductor substrate 1. In FIG. 5, reference numeral 3 represents an N⁺ area formed below the storage electrodes St1, St2, and charges under transfer are accumulated in the area 3.

Figure 7:
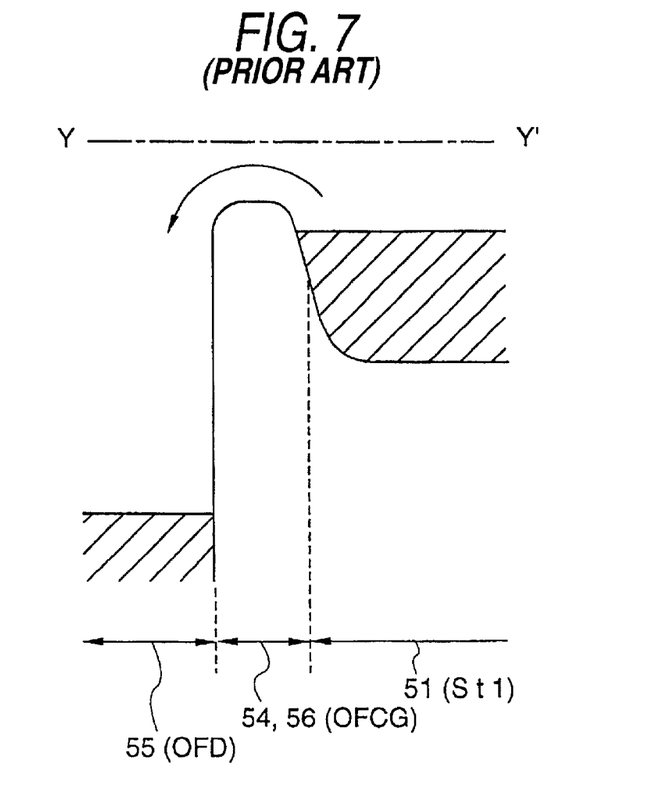
FIG. 7 is a potential diagram along Y–Y' of FIG. 5.

FIG. 7 is a potential diagram along Y–Y' of FIG. 5.

As shown in FIG. 7, the overflow control gate OFCG based on the gate electrode 54 and the N⁻ area 56 serves as a barrier, and charges flowing over the barrier are discarded to the overflow drain OFD.

With this construction, factors affecting the height of the barrier of the overflow control gate OFCG are the length of a portion of the gate electrode 54 of the overflow control gate OFCG that is not overlapped with the first-phase storage electrode St1, that is, the effective length of the overflow control gate OFCG, and the concentration of the impurities in the N⁻ area 56, etc.

Figure 8:
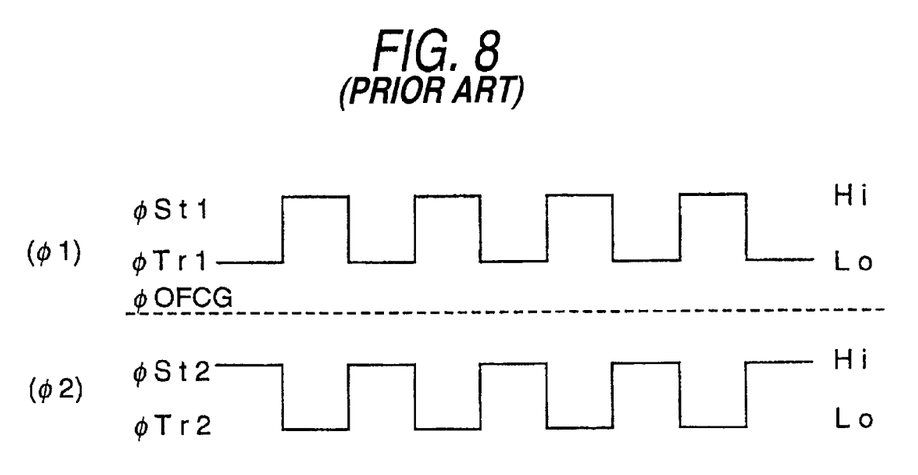
FIG. 8 is a timing chart of driving pulses in the construction of FIG. 5.

FIG. 8 is a timing chart showing the driving pulses in the construction of FIG. 5.

The driving pulse φSt1 of the first-phase storage electrode ST1 and the driving pulse φTr1 of the first-phase transfer electrode Tr1 are commonly applied by the same driving pulse (first-phase driving pulse φ1), and the driving pulse φSt2 of the second-phase storage electrode ST2 and the driving pulse φ Tr2 of the second-phase transfer electrode Tr2 are commonly applied by the same driving pulse (second-phase driving pulse φ2). The first-phase driving pulse and the second-phase driving pulse φ2 are opposite to each other in phase. The driving pulse φ OFCG of the overflow control gate OFCG has the same phase as the first-phase driving pulse φ1.

With this setting, the following charge transfer and overflow operation is carried out.

When the first-phase driving pulse φ1 is in high level Hi and charges exist in the first-phase storage electrode St1, the driving pulse φ OFCG of the overflow control gate OFCG is also in high level Hi and thus the overflow barrier is low in height, so that overflow can be induced with a predetermined amount of charges.

On the other hand, when the first-phase driving pulse φ1 is in low level Lo and charges are transferred from the first-phase storage electrode St1 to the adjacent second-phase electrodes Tr2, St2, the driving pulse φ OFCG of the overflow control gate OFCG is also in low level Lo and thus the overflow barrier is high in height, so that the charges under transfer can be prevented from flowing over the barrier.

However, in the case of the above conventional technique, if a positional displacement occurs between the first-phase storage electrode St1 formed of the first-layer polycrystal silicon layer serving as the lower layer and the gate electrode 54 of the overflow control gate OFCG formed of the second-layer polycrystal silicon layer serving as the upper layer, the effective length L1 of the overflow control gate OFCG would vary.

If the effective length L1 varies, the height of the barrier based on the overflow control gate OFCG is also varied. Further, the relationship between the effective length L1 and the effective length L of the transfer electrode Tr1 which determines the height of the barrier of the transfer channel 50 is also varied.

In addition, the height of the barrier based on the overflow control gate OFCG is also varied due to the positional displacement between the N⁻ area 56 and the gate electrode 54, the dispersion in line width among the polycrystal silicon layer 51 serving as the lower layer and the polycrystal silicon layers 52, 54 serving as the upper layer, etc.

When the dispersion such as the positional displacement or the like is large, the difference between the barrier height of the overflow control gate OFCG and the barrier height of the transfer electrode Tr1 decreases or excessively increases, so that there occurs such a case that the overflow control cannot be properly performed. This problem obstructs the fine control and microstructuring design of solid-state image pickup devices.

SUMMARY OF THE INVENTION

Therefore, an object of the present invention is to provide a solid-state image pickup device for performing proper overflow control.

In order to attain the above object, there is provided a solid-state image pickup device in which a transfer register is provided with an overflow control gate and an overflow drain, and the gate electrode of the overflow control gate is formed so as to be superposed on the lower-layer electrodes of the transfer register side and the overflow drain side.

According to the solid-state image pickup device of the present invention, since the gate electrode of the overflow control gate is formed so as to be superposed on the lower-layer electrodes of the transfer register side and the overflow drain side, the effective length of the overflow control gate is determined by the interval between the lower-layer electrodes of the transfer register side and the overflow drain side.

DETAILED DESCRIPTION OF THE PREFERRED EMBODIMENT

A preferred embodiment according to the present invention will be described hereunder with reference to the accompanying drawings.

According to the present invention, there is provided a solid-state image pickup device in which a transfer register is provided with an overflow control gate and an overflow drain, and the gate electrode of the overflow control gate is formed so as to be superposed on the lower-layer electrodes of the transfer register side and the overflow drain side.

Figure 1:
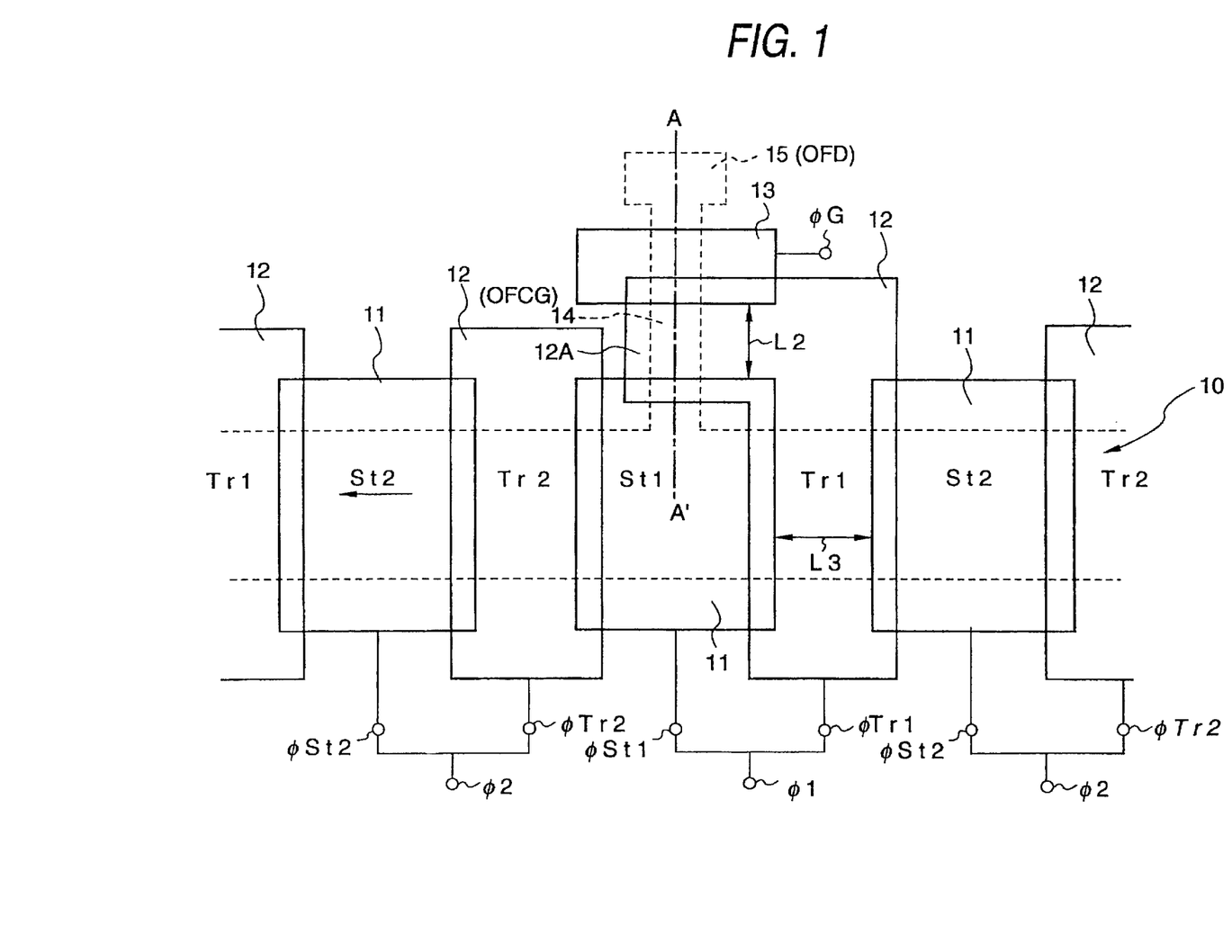
FIG. 1 is an enlarged plan view showing the main part of a transfer register of a CCD solid-state image pickup device according to an embodiment of the present invention.

FIG. 1 is an enlarged plan view showing the main part of a transfer register of a CCD solid-state image pickup device according to an embodiment of the present invention.

As shown in FIG. 1, first-layer transfer electrodes 11 and second-layer transfer electrodes 12 are alternately arranged on a transfer register 10. The first-layer transfer electrodes 11 serve as storage electrodes St1, St2, and the second-layer transfer electrodes 12 serve as transfer electrodes Tr1, Tr2.

A first-phase driving pulse $\phi1$ is applied as driving pulses $\phi$St1, $\phi$Tr1 to the storage electrode St1 and the transfer electrode Tr1 respectively, and a second-phase driving pulse $\phi2$ is applied as driving pulses $\phi$St2, $\phi$Tr2 to the storage electrode St2 and the transfer electrode Tr2, respectively.

In this embodiment, particularly an overflow control gate OFCG and an overflow drain OFD are provided at the side of the first-phase storage electrode St1 disposed substantially at the center of FIG. 1, and further a gate 13 is provided between the overflow control gate OFCG and the overflow drain OFD.

Figure 2:
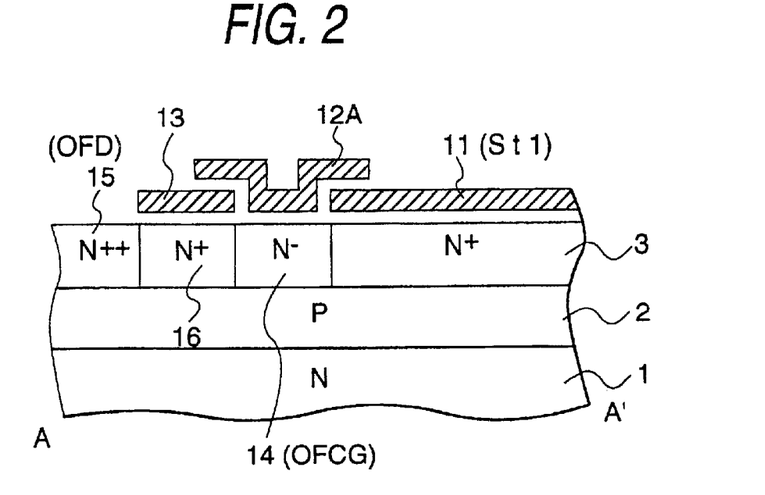
FIG. 2 is a cross-sectional view taken along A–A' of FIG.

FIG. 2 is a cross-sectional view taken along A–A' of FIG. 1. In FIG. 2, a semiconductor substrate 1, a P-type well region 2 and an N$^+$ area 3 for the storage electrodes St1, St2 are the same as shown in FIG. 6, and thus the same reference numerals are affixed to these elements.

As shown in FIGS. 1 and 2, the overflow control gate OFCG comprises an N$^-$ area 14 and a gate electrode formed of an extension portion 12A of the L-shaped second-layer transfer electrode 12 constituting the first-phase transfer electrode Tr1.

The gate electrode 12A is conducted to the first-phase transfer electrode Tr1, and thus the driving pulse $\phi$Tr1 of the first-phase transfer electrode Tr1 is applied to the gate electrode 12A.

The N$^-$ area 14 is formed by ion-implanting N-type impurities into the P-type well region 2 of the semiconductor substrate 1.

The overflow drain OFD is constructed by an N$^{++}$ area 15 formed by ion-implanting high-concentration N-type impurities into the P-type well region 2 of the semiconductor substrate 1.

The gate 13 between the overflow control gate OFCG and the overflow drain OFD is formed of the same first-layer polycrystal silicon layer as the first-phase storage electrode St1. A driving pulse $\phi$G is applied to the gate 13.

The gate electrode 12A of the overflow control gate OFCG is located on the storage electrode St1 formed of the first-layer polycrystal silicon layer at the side of the transfer register 10. This point is the same as the construction of FIG. 5.

In addition, the gate electrode 12A of the overflow control gate OFCG is located on the gate 13 formed of the first-layer polycrystal silicon layer at the side of the overflow drain OFD. This point is different from the construction of FIG. 5.

Accordingly, the interval between the gate 13 and the first-phase storage electrode St1 formed of the first-layer polycrystal silicon layer determines the effective length L2 of the overflow control gate OFCG formed by the second-layer polycrystal silicon layer formed on the interval.

Figure 3:
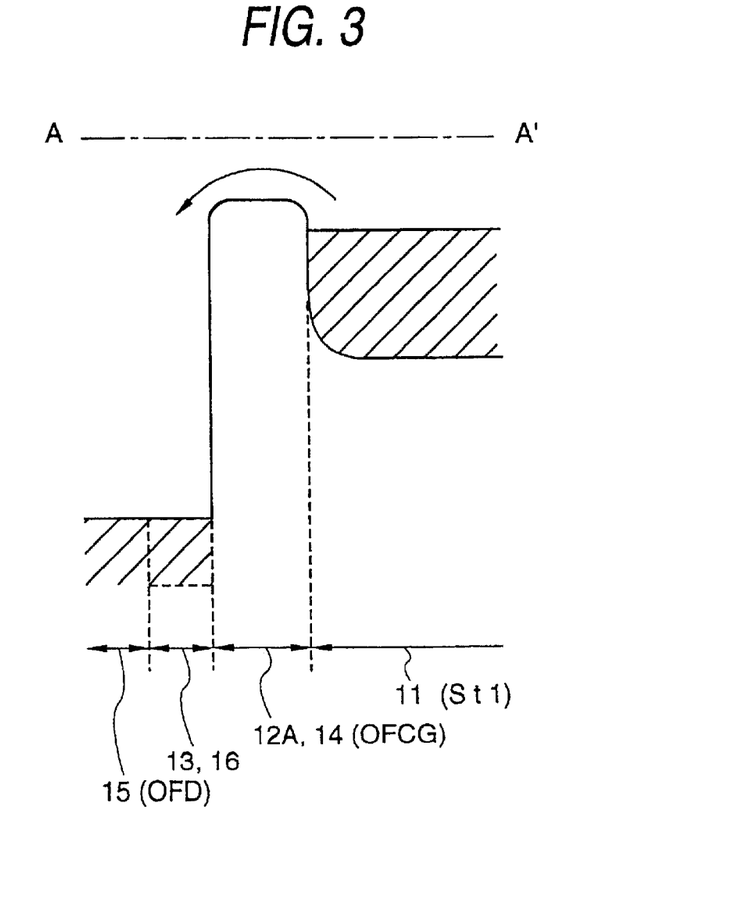
FIG. 3 is a potential diagram along A–A' of FIG. 1.

FIG. 3 is a potential diagram along A–A' of FIG. 1.

As shown in FIG. 3, the overflow control gate OFCG based on the gate electrode 12A and the N$^-$ area 14 serves as a barrier, and charges flowing over the barrier can be discarded to the overflow drain OFD.

In the above construction, the factors affecting the height of the overflow barrier are the length L2 of a portion of the lower layer of the gate electrode 12A of the overflow control gate OFCG which is not overlapped with the electrodes St1 and 13, that is, the effective length of the overflow control gate OFCG and the concentration of impurities of the N$^-$ area 14.

Figure 4:
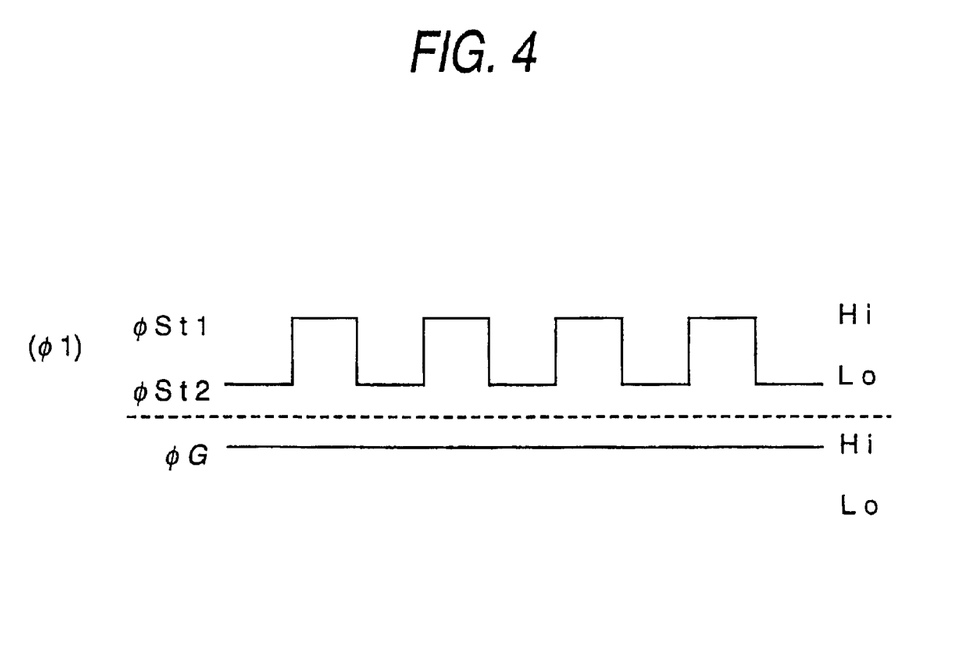
FIG. 4 is a timing chart of driving pulses in the construction of FIG. 1.

FIG. 4 is a timing charge of driving pulses in the construction of FIG. 1.

The same driving pulse (first-phase driving pulse $\phi1$) is applied to the driving pulse $\phi$St1 of the first-phase storage electrode St1 and the driving pulse $\phi$Tr1 of the first-phase transfer electrode Tr1.

Likewise, the same driving pulse $\phi$Tr1 ($\phi1$) is also applied to the gate electrode 12A of the overflow control gate OFCG conducted to the first-phase transfer electrode Tr1.

The driving pulse $\phi$G of the gate electrode 13 is set to high level Hi at all times. Accordingly, the gate 13 is set to On state at all times, and charges flowing over the barrier based on the overflow control gate OFCG can be discharged to the overflow drain OFD without disturbance.

The second-phase driving pulse $\phi2$ is the same as shown in FIG. 8, and thus the description thereof is omitted from FIG. 4.

Accordingly, the following charge transfer and overflow operation is carried out.

When the first-phase driving pulse $\phi1$ is in high level Hi, charges exist in the first-phase storage electrode St1, and the gate electrode 12A of the overflow control gate OFCG is in high level Hi, so that the height of the overflow barrier is low and the overflow can be induced with a predetermined amount of charges.

On the other hand, when the first-phase driving pulse φ1 is in low level Lo, charges are transferred from the first-phase storage electrode St1 to the adjacent second-phase electrodes Tr2, St2, and the gate electrode 12A of the overflow control gate OFCG is in low level Lo, so that the overflow barrier is high in height and thus the charges under transfer can be prevented from flowing over the barrier.

The interval L2 of the first-layer electrodes St1, 13 at both the sides thereof which corresponds to the effective length L2 of the overflow control gate OFCG is set to be narrower than the effective length L3 of the first-phase transfer electrode Tr1, that is, the interval of the storage electrodes St1, St2, whereby the barrier height of the overflow control gate OFCG is set to be lower than the barrier height of the transfer electrode Tr1.

In this embodiment, the interval of the first-layer electrodes 13, St1 at both the sides thereof is only the dispersion factor of the effective length L2 which determines the height of the barrier of the overflow control gate OFCG.

Both the barrier height of the overflow control gate OFCG and the barrier height of the transfer electrode Tr1 are set by the interval of the first-layer electrodes at both the sides thereof and the concentration of the impurities.

Accordingly, even when the interval of the first-layer electrodes 13 and St1 at both the sides of the overflow control gate OFCG and the concentration of the impurities of the N⁻ area 14 are dispersed, the overflow control gate OFCG and the transfer electrode Tr1 act so that the barrier is equally heightened (or lowered). That is, when one interval gets narrow, the other interval gets narrow likewise. Accordingly, the relationship of both the barriers is kept to a substantially predetermined value irrespective of the interval of the first-layer electrodes and the concentration of the impurities. Therefore, the control of the overflow barrier can be performed with very high precision.

The overflow control gate OFCG and the overflow drain OFD of the above construction is provided at some midpoint of the transfer register 10 for carrying out charge transfer in the solid-state image pickup device.

For example, in a line sensor, the overflow control gate OFCG and the overflow drain OFD are provided at one place between some sensor (pixel) locating portion and an output portion in each transfer register. When charges are read out at both the sides of each sensor and then joined to each other in front of the output portion, they are provided before the charges are joined to each other.

Further, in an area sensor, the overflow control gate OFCG and the overflow drain OFD may be provided at the connection portion from a vertical transfer register to a horizontal transfer register or at some midpoint of the horizontal transfer register.

According to the above embodiment, since the effective length L2 of the overflow control gate OFCG is determined by the interval between the first-layer electrodes 13, St1 at both the sides thereof, the dispersion factor of the barrier height of the overflow control gate can be reduced.

Even when the interval between the first-layer electrodes at both the sides thereof is dispersed, the effective length L3 of the transfer electrode Tr1 is also varied interlockingly with the dispersion, so that the relationship between the height of the barrier based on the overflow control gate OFCG and the height of the barrier based on the transfer electrode Tr1 is kept to a predetermined relationship.

That is, the proper overflow control can be performed by the construction of this embodiment. Accordingly, the fine control and the microstructuring design of the solid-state image pickup devices can be performed.

Further, in the above embodiment, the gate electrode 12A of the overflow control gate OFCG and the first-phase transfer electrode Tr1 are formed as an L-shaped unified pattern, so that both the overflow control gate OFCG and the transfer electrode Tr1 can be driven by providing only one contact portion.

Accordingly, it is unnecessary to individually provide a contact portion, and thus electrodes can be more minutely designed as compared with the conventional technique. Furthermore, by providing the contact portion at the corner portion of the L-shape, the effective length L2 and L3 of the overflow control gate OFCG and the transfer electrode Tr1 at the contact portion can be freely set irrespective of the contact portion.

In the above embodiment, the gate electrode 12A of the overflow control gate OFCG and the first-phase transfer electrode Tr1 are formed as a unified pattern. However, they may be formed separately like the conventional example of FIG. 5. In this case, a contact portion is provided to each of the gate electrode 12A and the first-phase transfer electrode Tr1 and then the same first-phase driving pulse φ1 is applied to them.

The above embodiment relates to a two-layer two-phase driving type, however, the present invention may be likewise applied to other driving type transfer registers such as a three-phase type, a four-phase type, etc. In any driving type, the height of the overflow barrier can be determined by the interval of the polycrystal silicon layer serving as a lower layer.

The present invention is not limited to the above embodiment, and various modifications may be made without departing from the subject matter of the present invention.

As described above, according to the present invention, the dispersion factor of the barrier height of the overflow control gate can be reduced, and the proper overflow control can be performed. Accordingly, the present invention enables the fine control and the microstructuring design of the solid-state image pickup device.

What is claimed is:

1. A solid-state image pickup device, characterized in that a transfer register is provided with an overflow control gate and an overflow drain, and a gate electrode of said overflow control gate is formed so as to be superposed on both the lower-layer electrodes of a transfer register side and an overflow drain side.

2. A solid-state image pickup device comprising:
   a first transfer register electrode having an overflow gate portion and a transfer register portion;
   a first storage electrode;
   an overflow drain; and an overflow control gate providing an electrical barrier to charge flow from the overflow gate portion to the overflow drain.

3. The solid-state image pickup device according to claim 2, wherein the overflow gate portion is disposed on the overflow control gate.

4. The solid-state image pickup device according to claim 2, further comprising:

a plurality of transfer electrodes; and a plurality of storage electrodes alternately disposed with the plurality of the transfer electrodes along a direction;

wherein the first transfer electrode is one of the plurality of transfer electrodes, the first storage electrode is one of the plurality of storage electrodes adjacent to the first transfer electrode;

wherein the overflow control gate is disposed next to the first storage electrode;

wherein the overflow drain is positioned on an opposite side of the overflow control gate from the first storage electrode; and wherein the overflow gate portion is disposed on the overflow control gate.

5. The solid-state image pickup device according to claim 4, further comprising:

a second gate area located between the overflow control gate and the overflow drain;

wherein the second gate area conducts charge from the overflow control gate to the overflow drain when a gate voltage is supplied to the second gate area.

6. The solid-state image pickup device according to claim 5, wherein a gate voltage is continuously supplied to the second gate area.

7. The solid-state image pickup device according to claim 2, wherein only one driving electrode is connected to the first transfer electrode, the driving electrode supplying a driving voltage to the transfer electrode portion and the gate electrode portion.

* * * * *